United States Patent
Rapoport et al.

(10) Patent No.: US 8,461,841 B2
(45) Date of Patent: Jun. 11, 2013

(54) MEANS AND METHOD FOR THERMOREGULATING MAGNETS WITHIN MAGNETIC RESONANCE DEVICES

(75) Inventors: Uri Rapoport, Moshav Ben Shemen (IL); Ehud Katznelson, Ramat Yisha (IL)

(73) Assignee: Aspect Imaging Ltd., Shoham (IL)

( * ) Notice: Subject to any disclaimer, the term of this patent is extended or adjusted under 35 U.S.C. 154(b) by 0 days.

(21) Appl. No.: 13/393,256

(22) PCT Filed: Aug. 25, 2010

(86) PCT No.: PCT/IL2010/000692
§ 371 (c)(1),
(2), (4) Date: Jun. 19, 2012

(87) PCT Pub. No.: WO2011/024166
PCT Pub. Date: Mar. 3, 2011

(65) Prior Publication Data
US 2012/0249134 A1   Oct. 4, 2012

Related U.S. Application Data

(60) Provisional application No. 61/238,168, filed on Aug. 30, 2009.

(51) Int. Cl.
*G01V 3/00* (2006.01)
(52) U.S. Cl.
USPC .......................................... 324/318; 324/321
(58) Field of Classification Search
USPC .................. 324/318, 322, 14, 306, 300, 314, 324/303, 321
See application file for complete search history.

(56) References Cited

U.S. PATENT DOCUMENTS

| | | | |
|---|---|---|---|
| 5,101,638 A * | 4/1992 | White | 62/51.1 |
| 6,516,282 B2 * | 2/2003 | Hedlund et al. | 702/132 |
| 6,525,537 B2 * | 2/2003 | Nerreter | 324/322 |
| 6,838,964 B1 | 1/2005 | Knight et al. | |
| 6,906,517 B1 * | 6/2005 | Huang et al. | 324/315 |
| 6,909,283 B2 * | 6/2005 | Emeric et al. | 324/300 |
| 7,297,907 B2 | 11/2007 | Rapoport et al. | |
| 7,301,343 B1 * | 11/2007 | Sellers | 324/318 |

(Continued)

FOREIGN PATENT DOCUMENTS

| | | |
|---|---|---|
| JP | 01121044 A2 | 5/1989 |
| WO | 2007052275 A2 | 5/2007 |

OTHER PUBLICATIONS

International Search Report and Written Opinion dated Jan. 25, 2011 in corresponding International Application No. PCT/IL2010/000692.

(Continued)

*Primary Examiner* — Louis Arana
(74) *Attorney, Agent, or Firm* — The Law Offices of Michael E. Kondoudis

(57) ABSTRACT

The present invention discloses to a magnetic resonance device consisting of magnets housed within a cage, a thermal regulating system (TRS) adapted to thermoregulate the magnets to room temperature $T \pm \Delta T$. TRS comprising a (i) preset array of one or more opened-bore channels provided within the cage and/or within the magnets; and, (ii) means for forcing fluid throughout the array of opened-bore channels, such that temperature T of the magnets is regulated to a preset range of $\Delta T$.

28 Claims, 13 Drawing Sheets

U.S. PATENT DOCUMENTS

2001/0013779 A1 8/2001 Marek
2002/0050895 A1 5/2002 Zuk et al.
2005/0030028 A1 2/2005 Clarke et al.
2007/0260291 A1 11/2007 Hunter et al.
2008/0001601 A1 1/2008 Sellers et al.
2008/0259560 A1 10/2008 Lvovsky
2009/0120615 A1 5/2009 Icoz et al.

OTHER PUBLICATIONS

International Preliminary Report on Patentability dated Nov. 17, 2011 in corresponding International Application No. PCT/IL2010/000692.

* cited by examiner

MEANS AND METHOD FOR THERMOREGULATING MAGNETS WITHIN MAGNETIC RESONANCE DEVICES

FIELD OF INVENTION

The present invention generally relates to a means and method for abstracting heat from a magnetic resonance electromagnet, and thermoregulating the magnets in the magnetic assembly of a magnetic resonance device.

BACKGROUND OF THE INVENTION

A magnetic resonance imaging device produces a measurement of a sample which is based upon its molecular structure. The sample is subjected to a polarizing magnetic field which has the effect of aligning the spins of all the atomic nuclei of the sample. Radio waves at a frequency close to the Larmor frequency of the nuclei are then used to excite the nuclei such that their magnetic alignment is reversed. Once the excitation is removed the nuclei return to their original state by emitting characteristic radio signals. It is these radio signals that can be used to image the sample.

The exact Larmor frequency is dependent upon the precise magnetic field. By creating a magnetic field gradient within the sample cavity the source of these signals can be located such that an overall image of the sample can be constructed.

The efficiency of this process depends upon the consistency of the magnetic field strength within the sample cavity. This field is typically controlled to within 5 parts per million. The extent of the uniformity of the magnetic field determines the accuracy with which the Larmor precession frequency can be measured. This allows for the resolution of smaller chemical shifts.

The magnetic field is dependent to a large extent upon the ferromagnetic properties of the materials making up its magnetic assembly. These ferromagnetic characteristics are often temperature dependent and so it is important to thermoregulate the magnetic assembly. This can be particularly problematic where the temperature of the sample being imaged is itself fluctuating. In such a scenario it is necessary to introduce a means of insulating the magnetic assembly from the magnetic assembly.

U.S. Pat. No. 7,297,907B2 to Rapaport, which is incorporated within in its eternity provides a means and method for maintaining constant temperature in the magnetic assembly of a magnetic resonance device. However this device requires the use of an envelope, a fluid of high heat capacity, pumps, heat pumps, and a heater, which may add cost and inconvenience to such a system as compared to a system employing passive insulation only.

However passive insulation is insufficient to stabilize a sensitive permanent-magnet magnetic resonance system or the object under investigation, due to sensitive temperature coefficients causing the magnetic field of the system to fluctuate beyond an acceptable range.

Similarly, Japanese application 01121044A2 to Yoshiyuki provides an MRI device that dispenses with refrigerant in a superconductive MRI magnet by making use of active electronic Peltier cooling devices. However these devices are notorious for their low electronic efficiency and high cost, making a system based on such devices economically unwieldy.

There is thus a long felt need in the art for a cost effective means and method of thermoregulating the magnets within a magnetic resonance device.

SUMMARY OF THE INVENTION

It is one object of the present invention to provide in a magnetic resonance device (MRD) consisting of magnets housed within a cage, a thermal regulating system (TRS) adapted to thermoregulate said magnets to room temperature $T \pm \Delta T$; said TRS comprising a (i) preset array of one or more opened-bore channels provided within said cage and/or within said magnets; and, (ii) means for forcing fluid throughout said array of opened-bore channels; such that temperature T of said magnets is regulated to a preset range of $\Delta T$.

It is another object of the present invention to provide the MRD as defined above, wherein said TRS further comprising: a plurality of temperature sensors disposed upon the surface of and/or within said magnets; and, a plurality of thermally-feedback regulating mechanisms (TRFMs) in communication with said sensors, adapted to provide at least one of the following members of a group consisting of (i) increase or decrease the fluid flow rate, (ii) increase or decrease the fluid flow flux and (iii) increase or decrease the temperature of fluid.

It is another object of the present invention to provide the MRD as defined above, wherein said temperature sensor is the resonance frequency of said magnet.

It is another object of the present invention to provide the MRD as defined above, wherein said forced fluid means force fluid into a perpendicular or parallel subset of said channels such that either a turbulent flow or a laminar flow is obtained within said channels.

It is another object of the present invention to provide the MRD as defined above, wherein one or more of said channels are provided with at least partially cylindrical profile characterized by a variable diameter.

It is another object of the present invention to provide the MRD as defined above, wherein the patterns of said flow is selected from a group consisting of laminar flow, turbulent flow, supersonic flow, and subsonic flow.

It is another object of the present invention to provide the MRD as defined above, wherein said $\Delta T$ in the range of about 0° C. to about 0.2° C. per hour.

It is another object of the present invention to provide the MRD as defined above, wherein said channels are provided with walls composed of electrically conductive material.

It is another object of the present invention to provide the MRD as defined above, wherein said channels are at least partially provided with electrically conductive mesh screens; said mesh screen are adapted to block the propagation of electromagnetic radiation into said channels.

It is another object of the present invention to provide the MRD as defined above, wherein the length of said channels protrude out from said MRD such that said length is about five times larger than the diameter of said channels.

It is another object of the present invention to provide the MRD as defined above, wherein the configuration of each of said channels is provided such that a range of angles of about 20° to about 90° is provided between pairs of said channels.

It is another object of the present invention to provide the MRD as defined above, wherein said temperature sensors are selected from a group consisting of: thermocouples, temperature dependent resistors, optoelectronic means, optical means, thermistors, bimetallic means, diodes, semiconductors, contact means, and noncontact means.

It is another object of the present invention to provide the MRD as defined above, wherein said feedback means is selected from a group consisting of: closed-loop feedback, PID control, electronic control, microprocessor means, and adaptive means.

It is another object of the present invention to provide the MRD as defined above, wherein said forced-fluid means are selected from a group consisting of: high-pressure lines, low-pressure lines, blowers, fans, and pumps.

It is another object of the present invention to provide a method for thermally regulating magnets within a magnetic resonance device (MRD), to room temperature temperature T±ΔT. The method comprises steps selected inter alia from obtaining said magnetic resonance device consisting of magnets housed within a cage; obtaining thermal regulating system (TRS), having a preset array of one or more opened-bore channels provided within said cage and/or within said magnets; and means for forcing fluid throughout said array of opened-bore channels; and forcing fluid throughout said array of opened-bore channels; thereby thermoregulating said temperature T of said magnets to said preset range of ΔT.

It is another object of the present invention to provide the method as defined above, additionally comprising step of disposing a plurality of temperature sensors upon the surfaces of and/or within said magnets.

It is another object of the present invention to provide the method as defined above, additionally comprising step of feedbackly regulating parameters associated with the output of said means for forcing said FFF throughout said array of channels according to said temperature sensors.

It is another object of the present invention to provide the method as defined above, additionally comprising step of providing flow patterns selected from a group consisting of turbulent flow, a laminar flow, supersonic flow or and subsonic flow within said channels via introducing said fluid into a perpendicular or Parallel subset [110] of said channels.

It is another object of the present invention to provide the method as defined above, additionally comprising step of providing said channels with at least partially cylindrical profile characterized by a variable diameter.

It is another object of the present invention to provide the method as defined above, additionally comprising step of selecting the patterns of said flow from a group consisting of laminar flow, turbulent flow, supersonic flow, and subsonic flow.

It is another object of the present invention to provide the method as defined above, additionally comprising step of selecting said ΔT is in the range of about 0° C. to about 0.2° C. per hour.

It is another object of the present invention to provide the method as defined above, additionally comprising step of providing said channels with walls composed of electrically conductive material.

It is another object of the present invention to provide the method as defined above, additionally comprising step of at least partially providing said channels with electrically conductive mesh screens; said mesh screen are adapted to block the propagation of electromagnetic radiation into said channels.

It is another object of the present invention to provide the method as defined above, additionally comprising step of configuring each of said channels such that a range of angles of about 20° to about 90° is provided between pairs of said channels.

It is another object of the present invention to provide the method as defined above, additionally comprising step of selecting said temperature sensors from a group consisting of: thermocouples, temperature dependent resistors, optoelectronic means, optical means, thermistors, bimetallic means, diodes, semiconductors, contact means, and noncontact means or any combination thereof.

It is another object of the present invention to provide the method as defined above, additionally comprising step of selecting said feedback means from a group consisting of: closed-loop feedback, PID control, electronic control, microprocessor means, and adaptive means or any combination thereof.

It is still an object of the present invention to provide the method as defined above, additionally comprising step of selecting said forced-fluid means from a group consisting of: high-pressure lines, low-pressure lines, blowers, fans, and pumps or any combination thereof.

It is lastly an object of the present invention to provide the method as defined above, additionally comprising step of screening electromagnetic radiation from propagating into said channels by at least partially providing said channels with electrically conductive mesh screens.

BRIEF DESCRIPTION OF THE FIGURES

In order to understand the invention and to see how it may be implemented in practice, few preferred embodiments will now be described, by way of non-limiting example only, with reference to the accompanying drawing, in which.

DETAILED DESCRIPTION OF THE EMBODIMENTS

Figure 1:
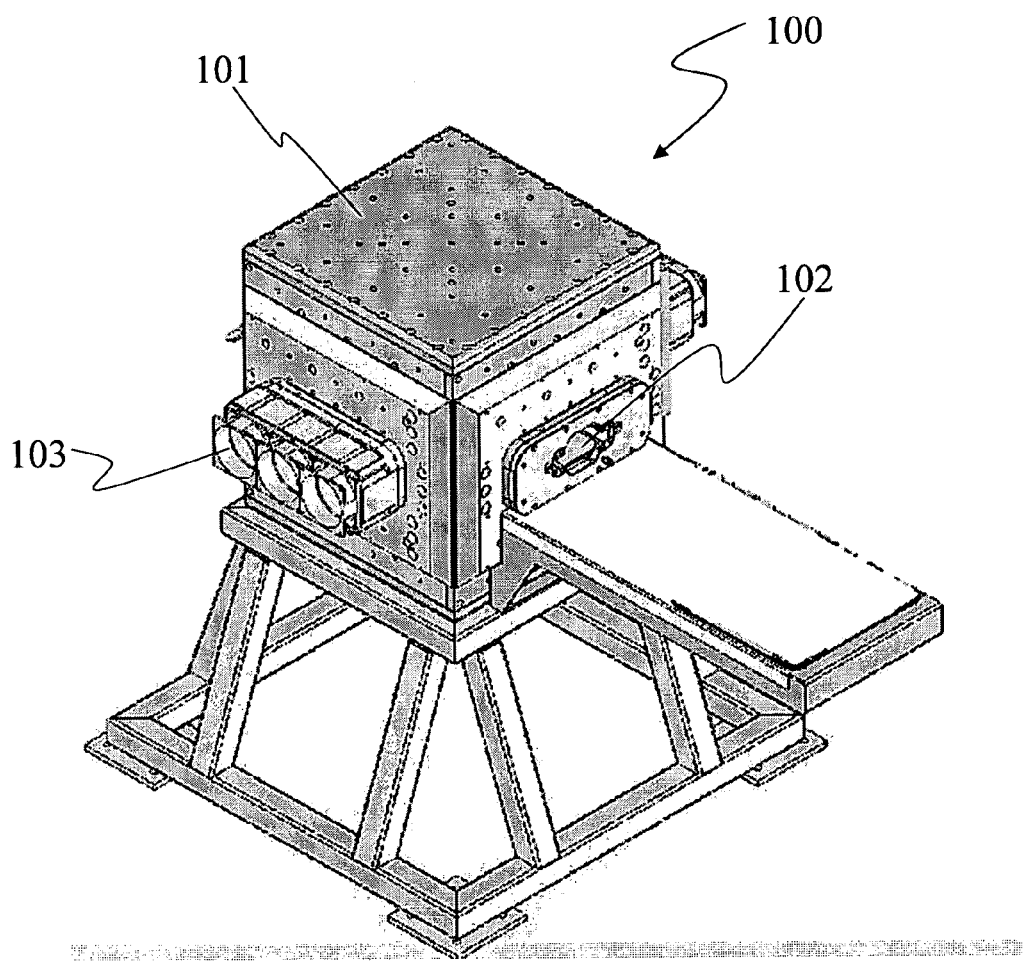
FIG. 1 schematically represents a magnetic resonance device in perspective view, showing the sample introduction device and side shafts.

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to a means and method for thermoregulating the magnetic assembly within magnetic resonance device such that the temperature of said magnetic assembly is not affected by any internal heat source.

The terms 'about' and 'approximately' interchangeably indicate hereinafter a relation of approximate equivalence between quantities to within ±20%.

The term 'accurately' indicates hereinafter a relation of approximate equivalence between quantities to within ±2%.

The term 'near' indicates hereinafter a relation of distance between about 1 nm and 1 m, and especially between about 1 mm and 10 mm.

The term 'largely' applies hereinafter to the most part, generally referring to at least 80% of the whole, or alternatively can be used to mean approximately.

The term 'magnetic resonance device' (MRD) applies hereinafter to a device such as an NMR, ESR, NQR or MRI device, adapted to measure the radio signals emitted from the nuclei of the atoms within a sample when said nuclei are excited by electromagnetic radiation.

The term 'active thermal regulation' applies hereinafter to any active means of thermoregulating the temperature at one or more points (such that internal heat source is not effecting the temperature). This may be achieved for example by devices based upon blowers, high pressure lines, low pressure lines, shielding fluid, peltier devices, layers of heating materials, chillers, heat pumps, or any other means as will be obvious to one skilled in the art.

The term 'thermal shield' applies hereinafter to a body introduced between two or more others in order to prevent thermal transfer from one side to the other.

The term 'bore' or 'channel' refers to an open space through which air may be conducted. In a non limiting manner, the terms are selected from a group consisting of pipes, ducts, channels, lumens, capillaries, tubes etc of any size, cross section or shape, being either rigid of flexible and made of any relevant materials. The bores and channels may comprise valves, regulators, pistons, controllers, orifices and nozzles, inner or out coatings, structural elements, chemical or physical additives etc.

The term 'subject introduction channel' refers to the channel in a magnetic resonance device through which the subject (or object under investigation) is introduced.

The term 'sample holding chamber' refers hereinafter to a movable container which may be introduced into the bore of an MRI device. This chamber may possibly be closed to the surrounding atmosphere to allow a specific gas composition to be maintained within it.

The term 'means for forcing fluid' refers hereinafter to any mechanism useful for providing a facilitated flow of fluid. In a non limiting manner, the means for forcing fluid is selected from a group consisting of fans, pistons, centrifugal pumps, rotary pumps or any other pumps, rotors, vents, motors, etc.

The term 'plurality' hereinafter refers to a positive integer, such as 1, 2, or 10.

The present invention provides a thermal regulating system (TRS) adapted to thermoregulate to room temperature $T \pm \Delta T$ magnets in a magnetic resonance device (MRD). The TRS comprising a (i) preset array of one or more opened-bore channels provided within said cage and/or within said magnets; and, (ii) means for forcing fluid throughout said array of opened-bore channels; such that temperature T of said magnets is regulated to a preset range of $\Delta T$.

It is according to one embodiment of the current invention to present, in a magnetic resonance device, an active temperature regulation method for preventing temperature fluctuations in the magnets (be they permanent or electromagnets) of a magnetic resonance device. This method comprises, in one embodiment, providing a plurality of sources of airflow, either chilled or at ambient temperature, into the bores of the device. By means of one or more feedback loops, one or more temperatures within the device may be independently thermoregulated. In particular, the temperature of the magnets housed within the MRI device is thermoregulated,(such that internal heat source eventually does not effect the magnets' temperature).

Reference is made now to FIG. 1, schematically presenting part of a magnetic resonance device, 100. In FIG. 1 this device is shown without the full magnet assembly instead only showing the top pole piece 101 under which lies (for example) a gradient coil. The sample is inserted into a sample-containing chamber 102, and one or more side bores 103 are provided additionally. In the case of live mammalian samples, the temperature of the sample will generally fluctuate between 85-120 degrees Celsius. In order to maintain the gradient coil at constant temperature this coil is thermally insulated from the sample insofar as possible by passive insulating layers. However due to the high precision required of the magnetic resonance measurement, which requires a highly homogenous and constant magnetic field and therefore a highly homogenous and constant temperature, passive insulation is insufficient to stabilize the magnet temperature to the level necessary for useful measurements to be performed. Thus some active means as in the method described herein becomes a necessity.

Figure 2A:
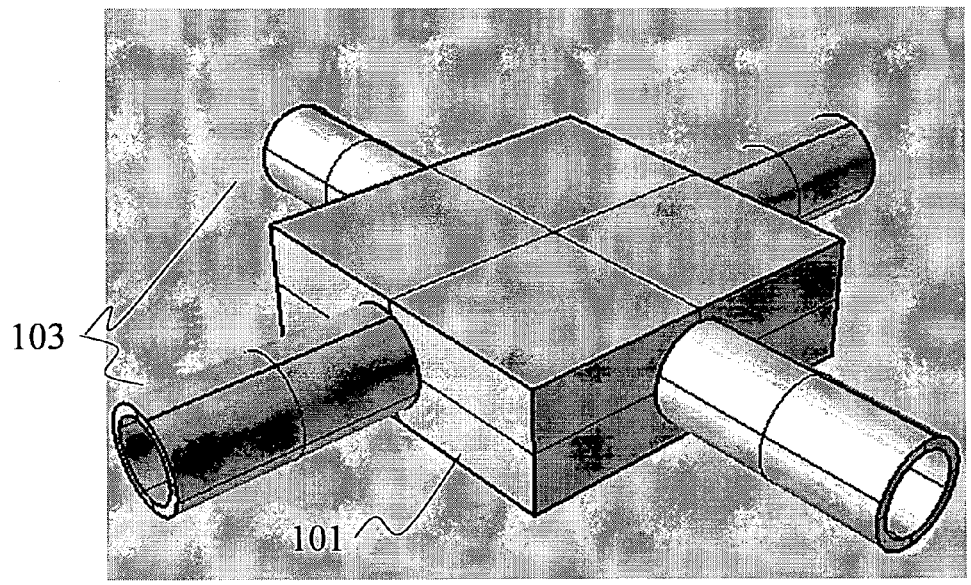
FIG. 2a and FIG. 2b schematically represents another embodiment of the magnetic resonance device in perspective view, showing the sample introduction device and side shafts.
Figure 2B:
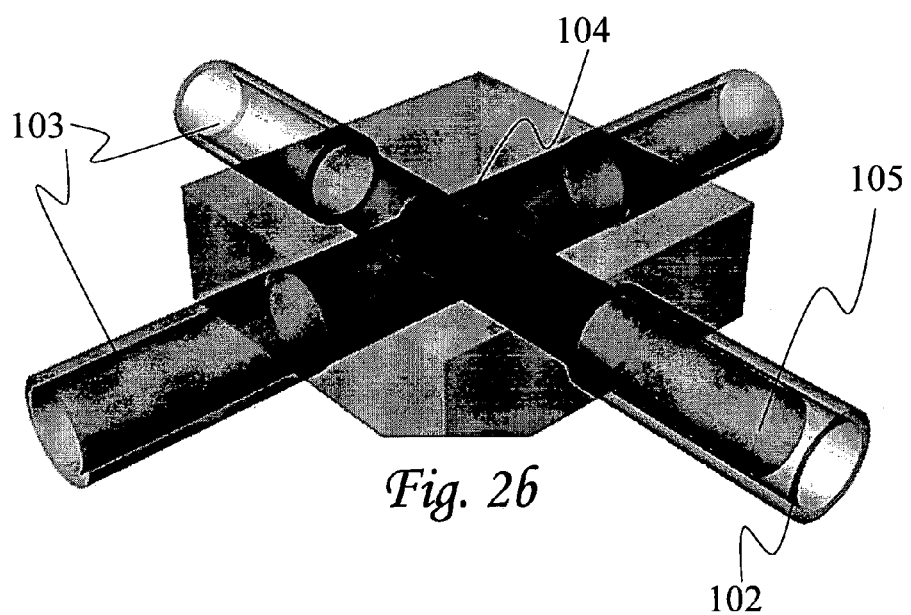
Figure 2C:
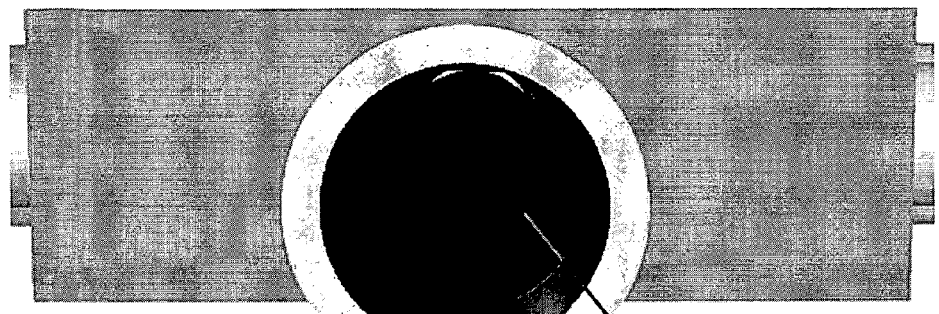
Figure 2D:
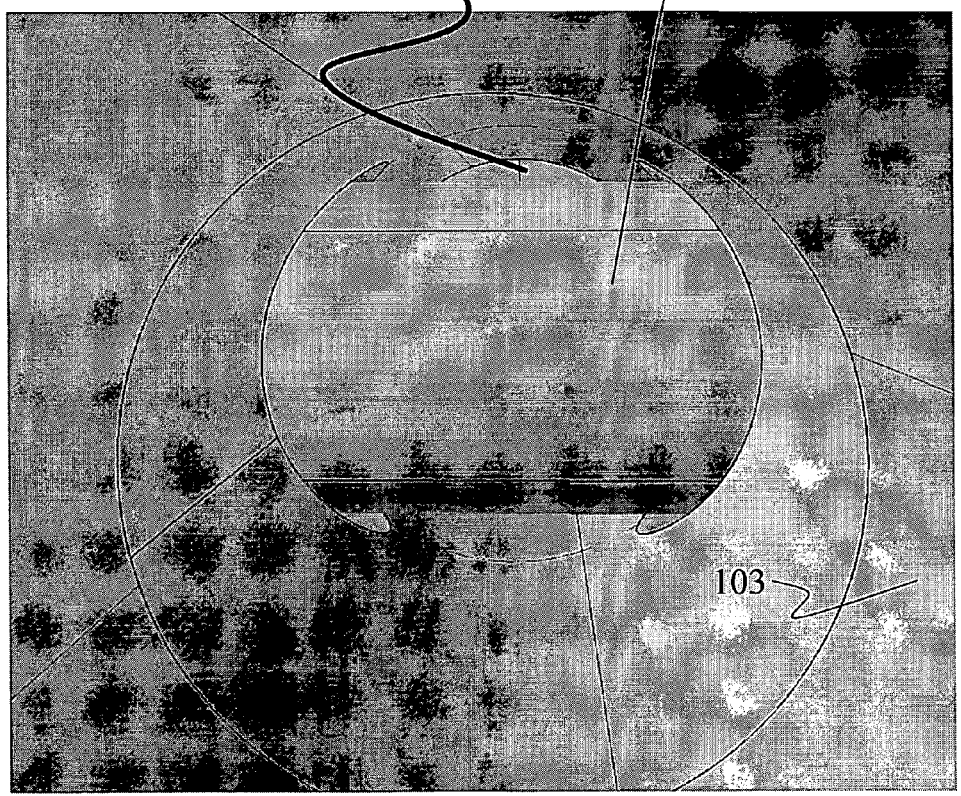
Figure 2E:
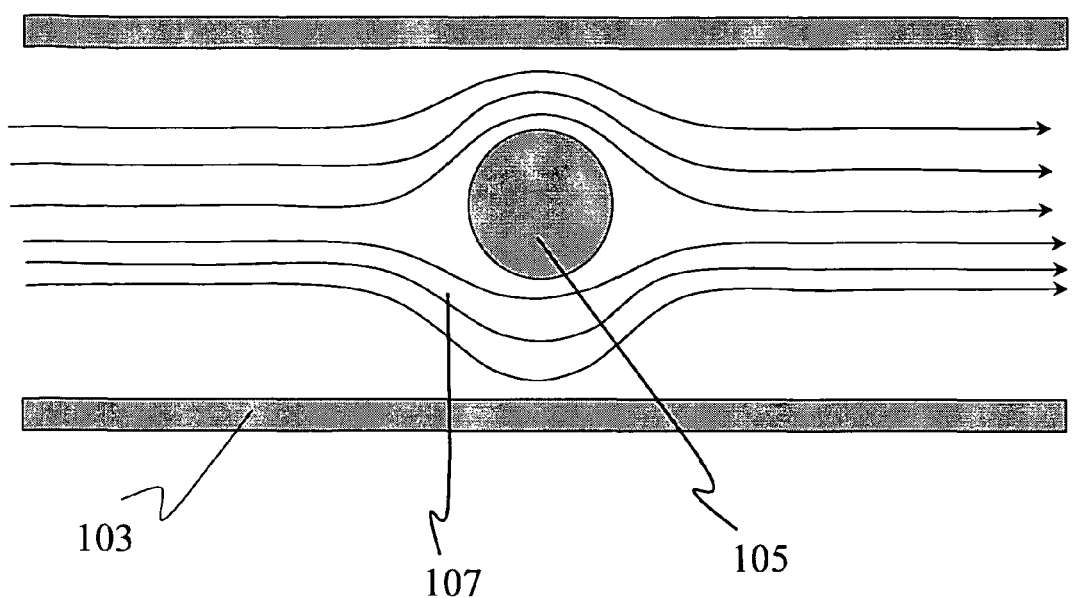
Figure 3A:
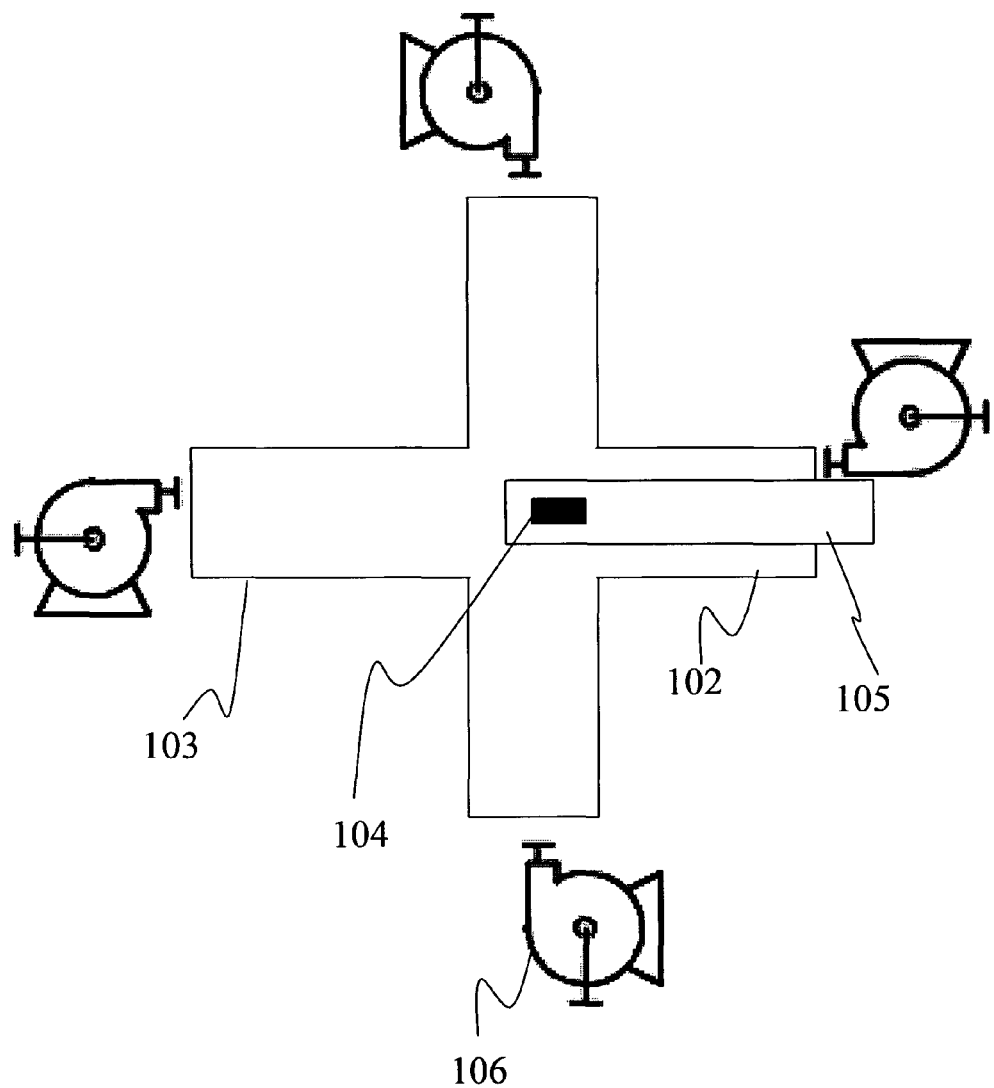
FIG. 3a-3f schematically represents the air flow through the various bores of the instrument; and, FIGS. 4a-4e schematically represents several possible arrangements for the air flow through the various bores of the instrument.
Figure 3B:
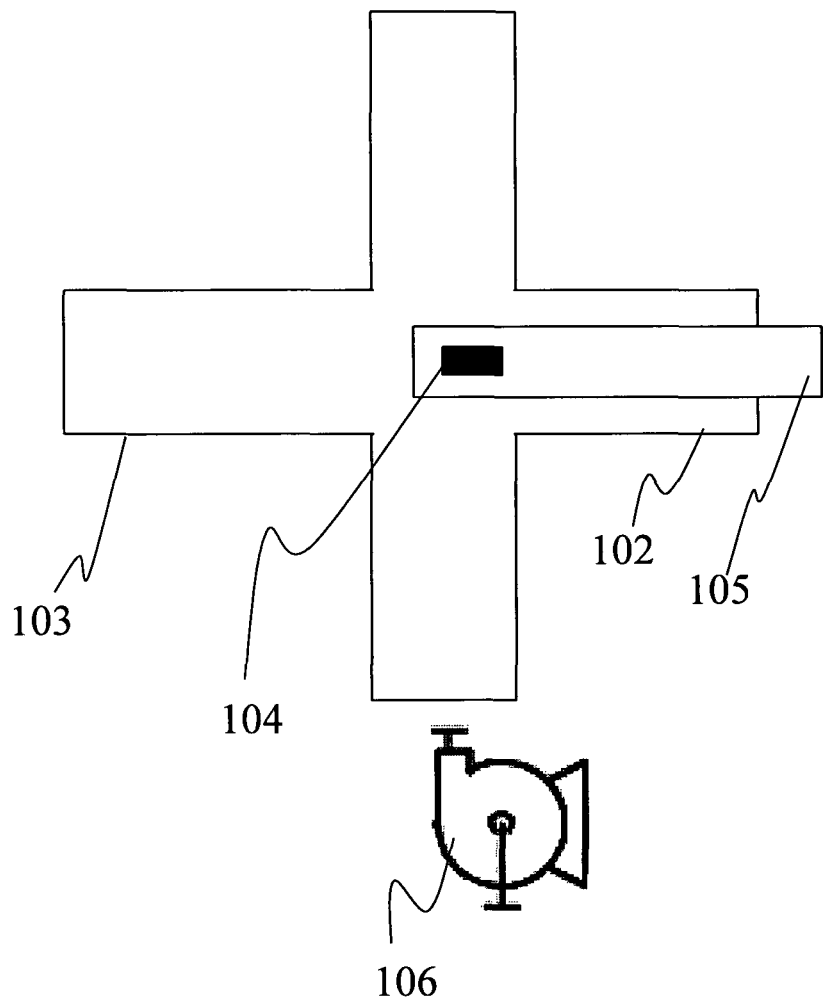
Figure 3C:
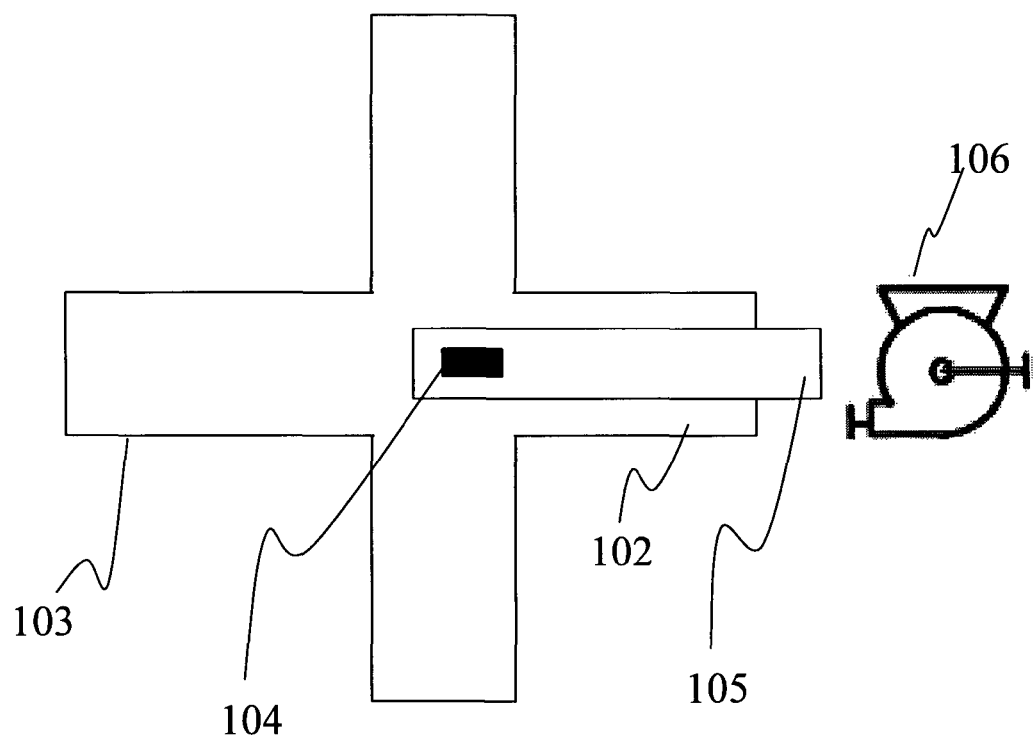
Figure 3D:
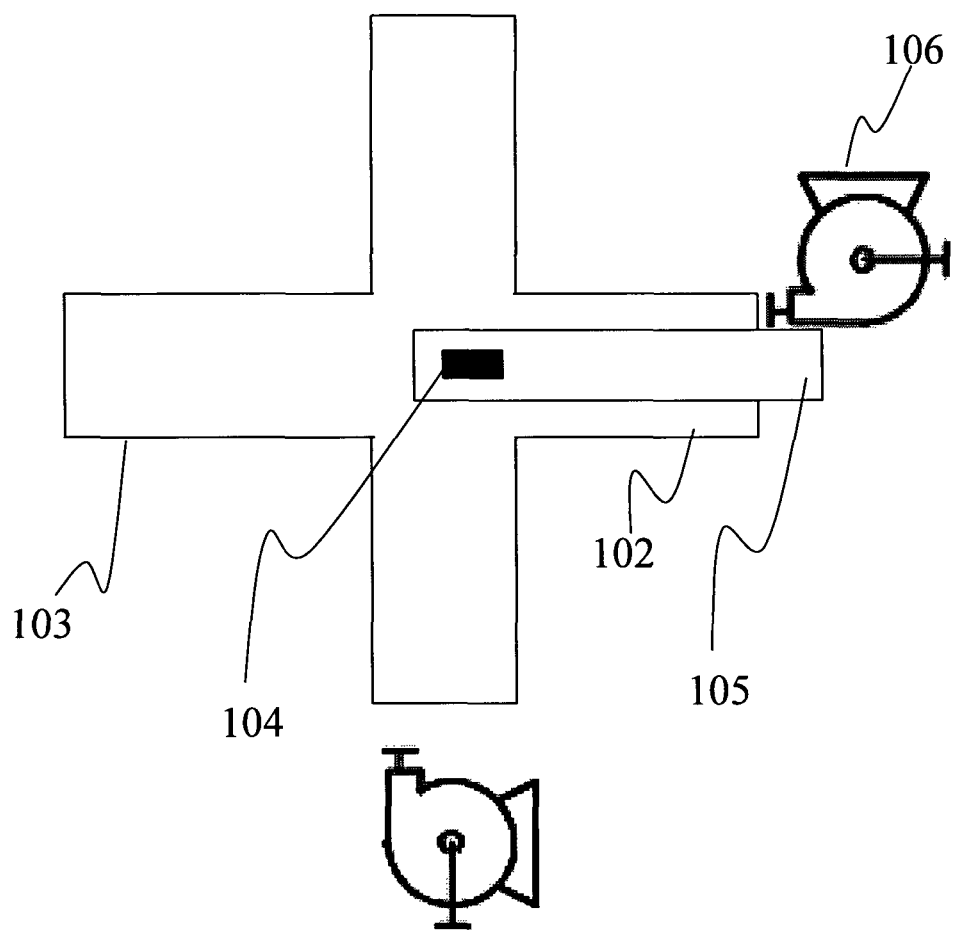
Figure 3E:
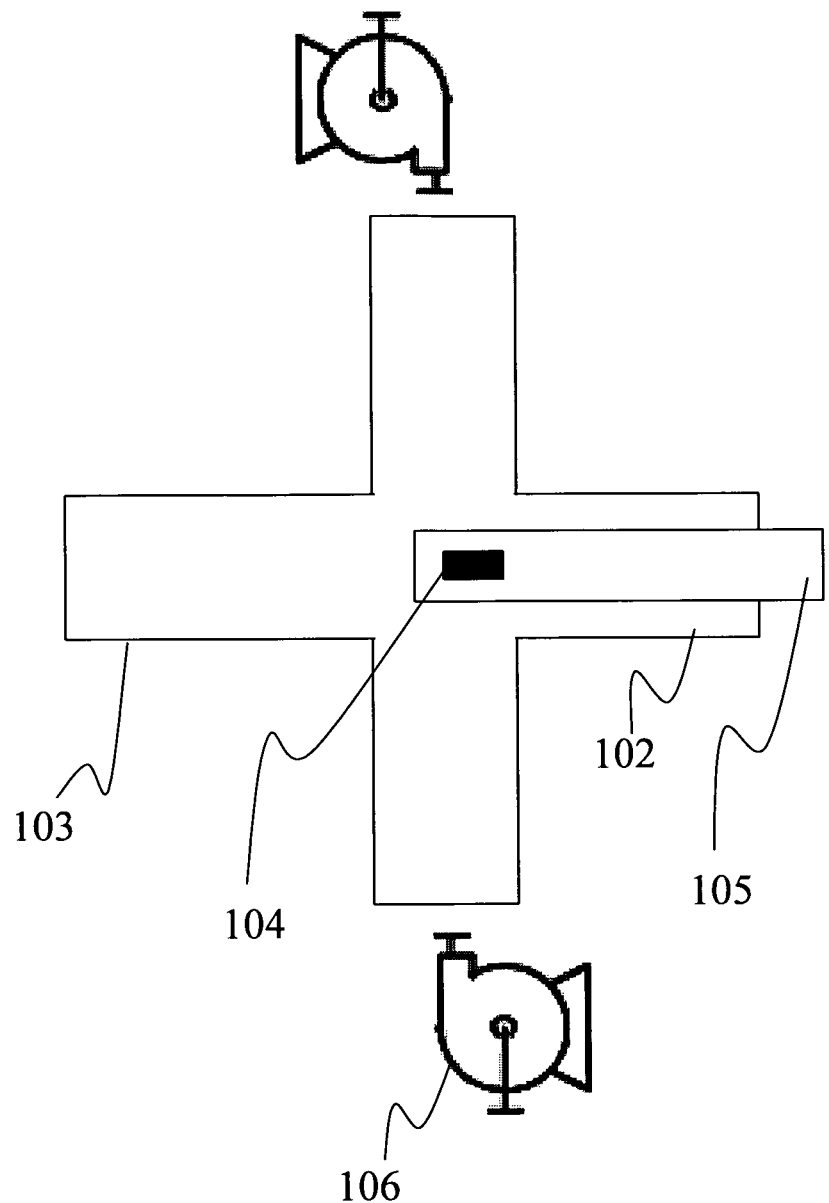
Figure 3F:
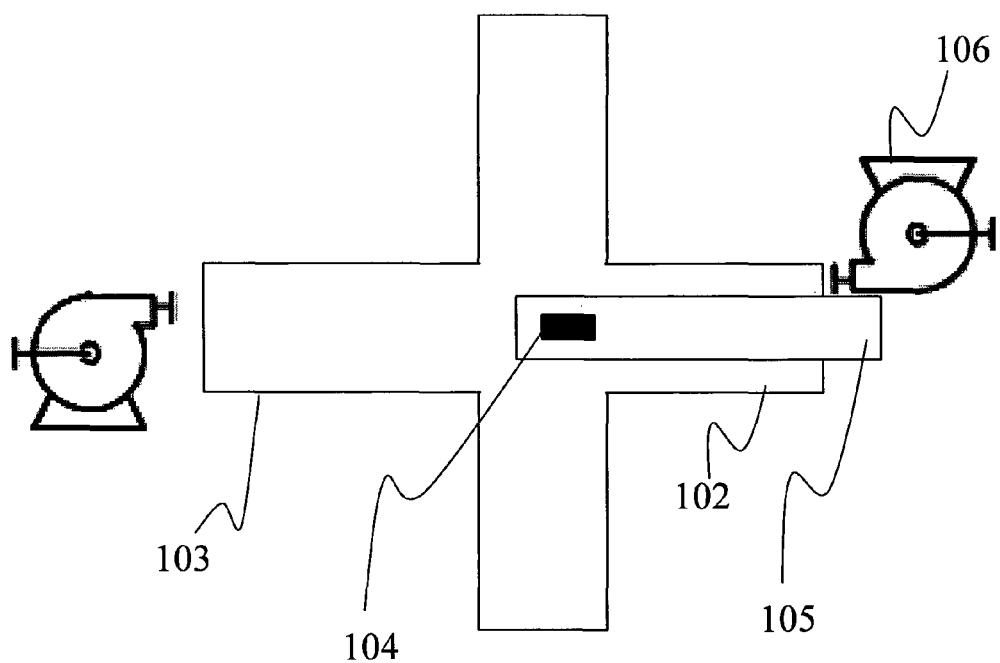

With reference to FIG. 2*a-d*, one sees a simplified perspective view of a possible embodiment of a magnetic resonance instrument of the present invention. The sample 104 (FIG. 2*b*) lies within the retractable sample containing chamber 105. This chamber, as well as its corresponding containing bore 102 and the side bores 103 are all provided with their own air flow systems. A small gap 106 (FIG. 2*c*) is created between the sample containing chamber 105 and its containing bore 102. This gap will cause a region of compressed flow lines 107 (FIG. 2*e*) around the sample containing chamber, in the manner of a Venturi tube demonstrating the Bernoulli effect. The form of the gap 106 is shown in FIG. 2*d*, which is a view from within a bore 103, within which one can glimpse the sample containing chamber 105 and the gap 106 around it.

It should be emphasized that while the drawings illustrate an embodiment in which the side bores 103 come into and out of the top pole piece 101 in the same plane as the pole piece 101, according to another embodiment said side bores 103 could enter and exit the pole piece 101 in the perpendicular plane.

According to another embodiment, any combination of horizontally and vertically side bores 103 could be utilized.

The independent air flow systems are shown schematically in FIG. 3, wherein the blowers 106 are shown with independent access to both sides of bores 102, 103. By means of the multiple sources of forced air, the flow through the system and over various magnet surfaces can be fixed in any desired flow regime, such as laminar or turbulent. Turbulent flow, for instance, will generally provide more efficient thermal interaction (greater heat transfer) than laminar flow. By forcing air into the system from three sides, and allowing it to exit from the fourth side, turbulent flow can be achieved. Obviously a number of permutations can be achieved with a set of four independent forced air sources, and cycling between configurations can further add to the time-varying and turbulent nature of the flow attained. For example, for a period of five seconds, air is blown into both containing bore ports, and no air is blown into the side bore ports. Then air is blown into both side bore ports, and no air is blown into the containing bore ports.

It is within provision of the invention that the air flow devices used be not restricted to providing positive pressure; a negative pressure may be achieved by use of a reversed blower, low-pressure line, or the like as will be obvious to one skilled in the art. Furthermore each blower or air supply/extraction means can in general be operated within some operating range of induced flow rate or pressure. Furthermore the air introduced into the system may be treated in various ways such as chilling and/or humidifying. In one embodiment of the invention, a myriad of configurations can be tested aforehand on a given geometric system to determine that configuration that best extracts heat from the system, and this optimal configuration can be employed within a feedback loop to provide the most efficient heat extraction.

In FIG. 3 a schematic diagram of the air flow system of the present invention is shown. Four blowers 106 are seen here, two at each end of the containing bore 102 and the side bore 103. The retractable sample containing chamber 105 may optionally be provided with its own air or gas supply. Temperature sensors are preferably provided both in the sample containing chamber and near or on the gradient field magnet, to allow for closed loop feedback to be used in the manner of a thermostat or temperature controller. For instance, when the temperature upon the electromagnet face rises, the air flow through the side and containing bores can be increased. In further embodiments of the invention, the air forced through the system is from the outside of the system (i.e., the ambient air).

The ambient air might be pretreated by means of cooling, humidifying, dehumidifying, filtering or otherwise, according to predetermined conditions. However, it is emphasized that the system as provided by the present invention does not cool, humidify, dehumidify, filter et cetera the forced air, it merely enforce it to enter the system. Said enforcement results in thermo-regulation of the magnets such that their temperature is not affected by ant internal heat source.

FIGS. 3b-3f illustrate different embodiments in which the number of blowers 106 is modified. As can be seen from FIG. 3b, the minimum number of blowers 106 is 1. Any combination of blowers is valid.

Figures 4A, 4B:
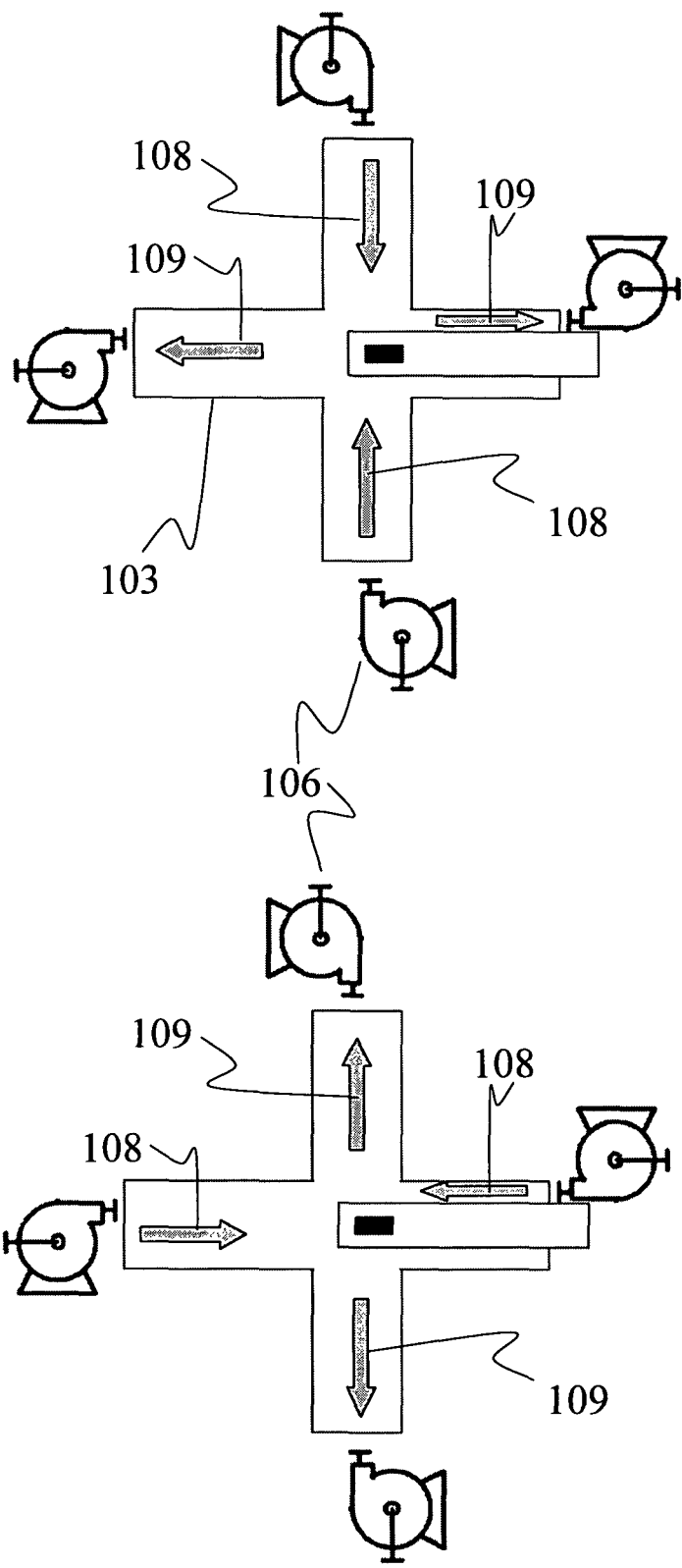
Figures 4C, 4D:
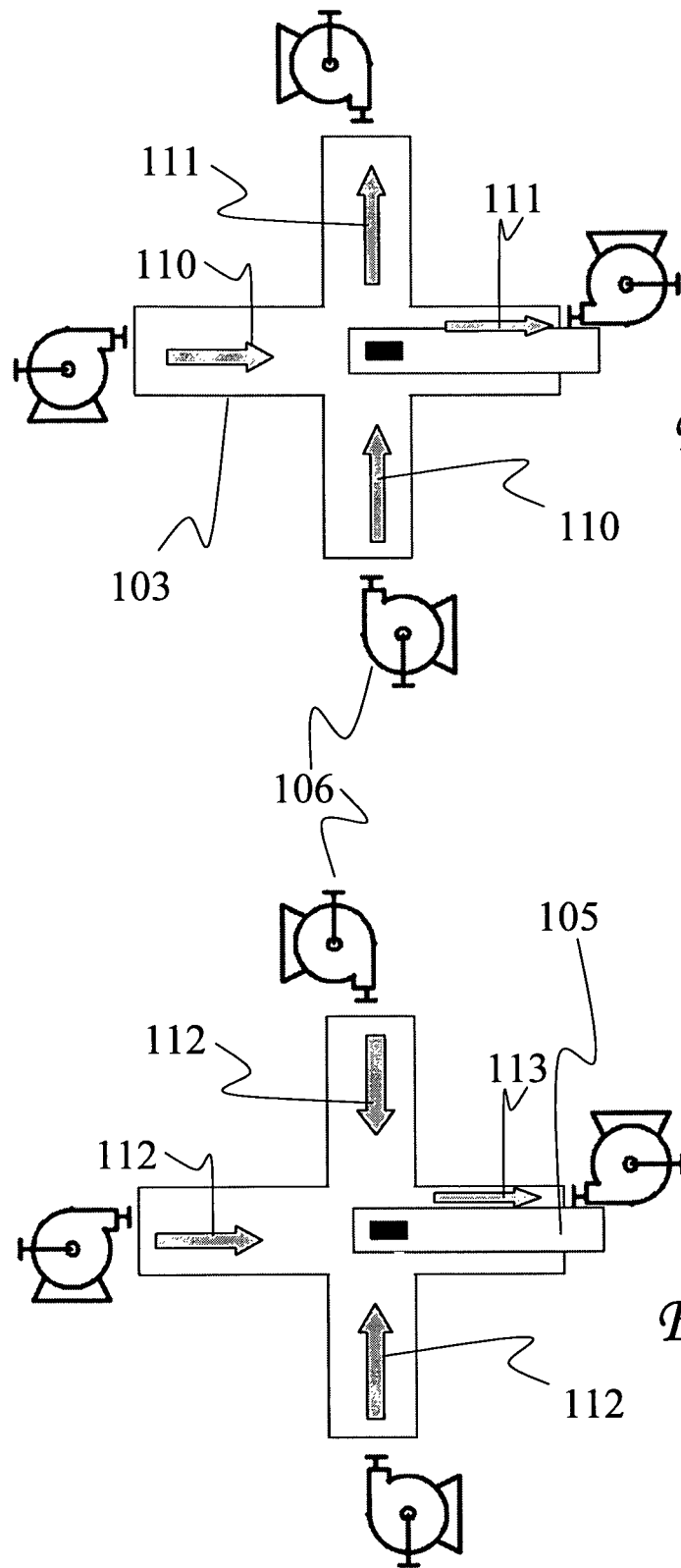

In FIGS. 4a and b a schematic depiction of a possible air sequence is shown. In FIG. 4a, flow is directed into the directions 108 and out from directions 109. In FIG. 4b the flow has been reversed. By means of such switching of flow directions, the flow pattern can be greatly controlled, for example introducing a high degree of turbulence into the flow. In FIGS. 4c,d the same idea is employed, but with perpendicular channels (instead of opposite channels) being employed simultaneously for forcing air into the system. In FIG. 4c, perpendicular channels 110 are employed to force air into the bores 103. The air thus exits the device through the remaining channels 111. This arrangement will allow for a decidedly different airflow than that shown for instance in FIGS. 4a,b, allowing for different flow regimes to be achieved. FIG. 4d takes this idea to an extreme, forcing air into the device through three channels 112 and allowing it to exit through the small channel 113, which has a small available flow area between the channel 103 and the sample holding chamber 105. This small flow area will cause an increase in velocity to maintain the steady-state mass flow, thus carrying more heat from the region between channel and sample holding chamber 105.

Figure 4E:
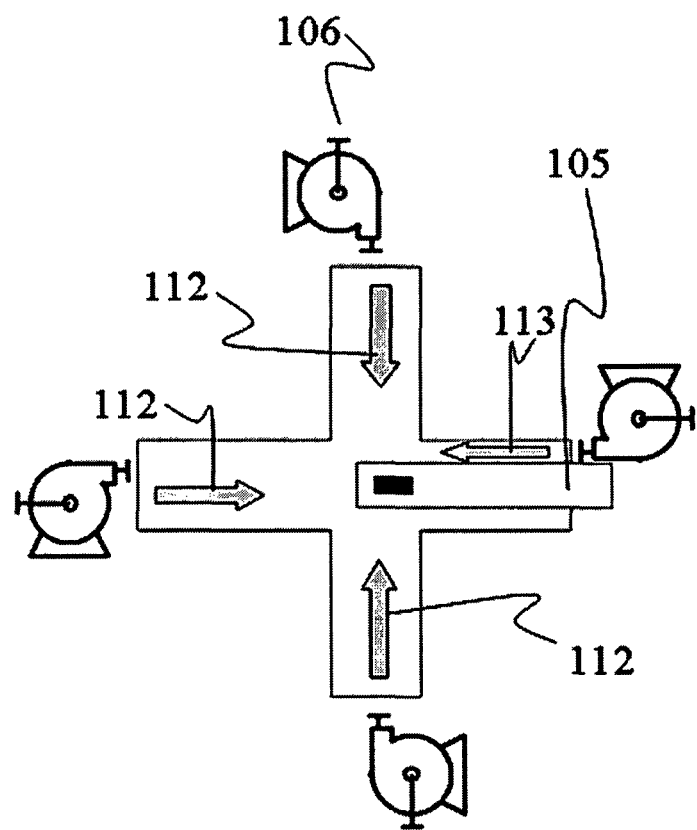

FIG. 4e takes this idea to a max extreme, forcing air into the device through four channels 112.

As is well known to practitioners of magnetic resonance measurements, the existence of stray electromagnetic radiation will act as a source of noise in these measurements, decreasing resolution and increasing necessary sampling times. Therefore care is generally taken to shield the measurement areas from stray electromagnetic radiation, often by means of a solid container of highly-conductive material acting as a Faraday cage. In order that a sufficient air flow be maintained for example for cooling purposes however, the current application requires large bores in the sides of the measurement apparatus to allow large amounts of ambient air to enter the system. To solve this difficulty, the current application provides the following solution. At the ends of the bores 102, 103 are disposed metal meshes of sufficient density to largely prevent the propagation of electromagnetic waves of radio frequency, while at the same time being of sufficient porosity to not materially impede a sensible flow of air through said mesh and into the guarded sample chamber. Such meshes may be placed at several locations along the length of the bore, as well as at the ends and/or along the length of the retractable sample introduction chamber.

A further provision of the invention to protect against radiation interference involves extending the bores of the device to some distance outside the magnetic resonance device. The bore walls are preferably composed of electrically conductive material such as metal, or provided with metal sleeves. Once the walls of the bore are made conductive, and the ends capped with conductive mesh in electrical contact with these walls, a so-called Faraday cage is implemented. Such a conductive cage has the well-known property that stray radiation cannot penetrate to any great extent within the cage. The depth of penetration depends amongst other things upon the frequency of radiation, the hole-size of the mesh, and the conductivity of the metals used. If, for instance, the length of the bore is made more than five times the diameter of the bore on each side, very little radiation will penetrate to the measurement area. Such an embodiment is seen in FIG. 2, where the bore exits 103 are seen to be extended out of the body of the machine for some distance. This distance may be increased to decrease the penetration of stray radiation into the measurement area of the machine.

Provision is made in the present application for the use of feedback to control the temperatures of the critical areas, namely the gradient field coil(s) and the sample chamber. As an example, thermocouples, temperature dependent resistors, or other temperature-sensing devices are employed, as will be obvious to one skilled in the art. These devices are placed at the critical areas which are required to be temperature-stabilized. Independent control loops, for example incorporating feedback control, are implemented using each of these temperature sensors, using such techniques as PID or the like as will be obvious to one skilled in the art. For instance when the temperature at a given sensor begins to rise past a predetermined setpoint, the speed of the airflow past that sensor is increased, or additional blowers are activated, or the temperature of incoming air is decreased. As part of the control algorithm, blowers may be activated and deactivated at different times and with variable flow rates to increase the turbulent nature of the flow.

In a preferred embodiment of the invention, a pair of channels is provided in the body of the magnetic resonance device, that are largely perpendicular to one another and in fluid communication. In this way when a flow of air is forced through one of the channel, a Venturi effects is created that tends to draw air in from the perpendicularly disposed channel. This will tend to cause turbulent flow which will prove beneficial insofar as it increases the rate of heat transfer between the flowing air and the surfaces of the channels.

In actual tests of embodiments of the system described above, highly accurate temperature stabilization was achieved. This can be quantified by measures such as the maximum temperature drift per time. In the tests undertaken, temperature drift was kept to less than 0.2° C. per hour. This extremely low drift allows for highly stable MR measurements to be taken, as described in the background.

As described above, it is one object of the present invention to provide in a magnetic resonance device (MRD) consisting of magnets housed within a cage, a thermal regulating system (TRS) adapted to thermoregulate said magnets to room temperature $T \pm \Delta T$; said TRS comprising a (i) preset array of one or more opened-bore channels provided within said cage and/or within said magnets; and, (ii) means for forcing fluid throughout said array of opened-bore channels; such that temperature T of said magnets is regulated to a preset range of $\Delta T$.

It is another object of the present invention to provide the MRD as defined above, wherein said TRS further comprising: a plurality of temperature sensors disposed upon the surface of and/or within said magnets; and a plurality of thermally-feedback regulating mechanisms (TRFMs) in communication with said sensors, adapted to provide at least one of the following members of a group consisting of (i) increase or decrease the fluid flow rate, (ii) increase or decrease the fluid flow flux and (iii) increase or decrease the temperature of fluid.

It is another object of the present invention to provide the MRD as defined above, wherein said temperature sensor is the resonance frequency of said magnet.

It is another object of the present invention to provide the MRD as defined above, wherein said forced fluid means force fluid into a perpendicular or parallel subset of said channels such that either a turbulent flow or a laminar flow is obtained within said channels.

It is another object of the present invention to provide the MRD as defined above, wherein one or more of said channels are provided with at least partially cylindrical profile characterized by a variable diameter.

It is another object of the present invention to provide the MRD as defined above, wherein the patterns of said flow is selected from a group consisting of laminar flow, turbulent flow, supersonic flow, and subsonic flow.

It is another object of the present invention to provide the MRD as defined above, wherein said $\Delta T$ in the range of about 0° C. to about 0.2° C. per hour.

It is another object of the present invention to provide the MRD as defined above, wherein said channels are provided with walls composed of electrically conductive material.

It is another object of the present invention to provide the MRD as defined above, wherein said channels are at least partially provided with electrically conductive mesh screens; said mesh screen are adapted to block the propagation of electromagnetic radiation into said channels.

It is another object of the present invention to provide the MRD as defined above, wherein the length of said channels protrude out from said MRD such that said length is about five times larger than the diameter of said channels.

It is another object of the present invention to provide the MRD as defined above, wherein the configuration of each of said channels is provided such that a range of angles of about 20° to about 90° is provided between pairs of said channels.

It is another object of the present invention to provide the MRD as defined above, wherein said temperature sensors are selected from a group consisting of: thermocouples, temperature dependent resistors, optoelectronic means, optical means, thermistors, bimetallic means, diodes, semiconductors, contact means, and noncontact means.

It is another object of the present invention to provide the MRD as defined above, wherein said feedback means is selected from a group consisting of: closed-loop feedback, PID control, electronic control, microprocessor means, and adaptive means.

It is another object of the present invention to provide the MRD as defined above, wherein said forced-fluid means are selected from a group consisting of high-pressure lines, low-pressure lines, blowers, fans, and pumps.

It is another object of the present invention to provide a method for thermally regulating magnets within a magnetic resonance device (MRD), to room temperature temperature $T \pm \Delta T$. The method comprises steps selected inter alia from obtaining said magnetic resonance device consisting of magnets housed within a cage; obtaining thermal regulating system (TRS), having: a preset array of one or more opened-bore channels provided within said cage and/or within said magnets; means for forcing fluid throughout said array of opened-bore channels; and forcing fluid throughout said array of opened-bore channels; thereby thermoregulating said temperature T of said magnets to said preset range of $\Delta T$.

It is another object of the present invention to provide the method as defined above, additionally comprising step of disposing a plurality of temperature sensors upon the surfaces of and/or within said magnets.

It is another object of the present invention to provide the method as defined above, additionally comprising step of feedbackly regulating parameters associated with the output of said means for forcing said FFF throughout said array of channels according to said temperature sensors.

It is another object of the present invention to provide the method as defined above, additionally comprising step of providing flow patterns selected from a group consisting of turbulent flow, a laminar flow, supersonic flow or and subsonic flow within said channels via introducing said fluid into a perpendicular or Parallel subset [110] of said channels.

It is another object of the present invention to provide the method as defined above, additionally comprising step of providing said channels with at least partially cylindrical profile characterized by a variable diameter.

It is another object of the present invention to provide the method as defined above, additionally comprising step of selecting the patterns of said flow from a group consisting of laminar flow, turbulent flow, supersonic flow, and subsonic flow.

It is another object of the present invention to provide the method as defined above, additionally comprising step of selecting said $\Delta T$ is in the range of about 0° C. to about 0.2° C. per hour.

It is another object of the present invention to provide the method as defined above, additionally comprising step of providing said channels with walls composed of electrically conductive material.

It is another object of the present invention to provide the method as defined above, additionally comprising step of at least partially providing said channels with electrically conductive mesh screens; said mesh, screen are adapted to block the propagation of electromagnetic radiation into said channels.

It is another object of the present invention to provide the method as defined above, additionally comprising step of configuring each of said channels such that a range of angles of about 20° to about 90° is provided between pairs of said channels.

It is another object of the present invention to provide the method as defined above, additionally comprising step of selecting said temperature sensors from a group consisting of: thermocouples, temperature dependent resistors, optoelectronic means, optical means, thermistors, bimetallic means, diodes, semiconductors, contact means, and noncontact means or any combination thereof.

It is another object of the present invention to provide the method as defined above, additionally comprising step of selecting said feedback means from a group consisting of: closed-loop feedback, PID control, electronic control, microprocessor means, and adaptive means or any combination thereof.

It is still an object of the present invention to provide the method as defined above, additionally comprising step of selecting said forced-fluid means from a group consisting of: high-pressure lines, low-pressure lines, blowers, fans, and pumps or any combination thereof.

It is lastly an object of the present invention to provide the method as defined above, additionally comprising step of screening electromagnetic radiation from propagating into said channels by at least partially providing said channels with electrically conductive mesh screens.

The invention claimed is:
1. In a magnetic resonance device (MRD) consisting of magnets housed within a cage, a thermal regulating system (TRS) adapted to thermoregulate said magnets to room temperature T±ΔT ; said TRS comprising;
   a. preset array of one or more opened-bore channels provided within said cage, within said magnets and any combination thereof; and
   b. means for forcing gas throughout said array of opened-bore channels; such that temperature T of said magnets is regulated to a preset range of ΔT,
   wherein said MRD device is substantially entirely at atmospheric pressure.
2. The MRD of claim 1, wherein said TRS further comprises:
   a. a plurality of temperature sensors disposed in a location selected from a group consisting of upon the surface of said magnets, within said magnets and any combination thereof; and
   b. a plurality of thermally-feedback regulating mechanisms (TRFMs) in communication with said sensors, adapted to provide at least one of the following members of a group consisting of
      i. increase or decrease said gas flow rate,
      ii. increase or decrease said gas flow flux and
      iii. increase or decrease the temperature of said gas.
3. The MRD of claim 2, wherein said temperature sensor is the resonance frequency of said magnet.
4. The MRD of claim 1, wherein said forced gas means force gas into a perpendicular or parallel subset of said channels such that either a turbulent flow or a laminar flow is obtained within said channels.
5. The MRD of claim 1, wherein one or more of said channels are provided with at least partially cylindrical profile characterized by a variable diameter.
6. The MRD of claim 1, wherein the patterns of said flow are selected from a group consisting of laminar flow, turbulent flow, supersonic flow, subsonic flow and any combination thereof.
7. The MRD of claim 1, wherein said ΔT is in a range of about 0° C. to about 0.2° C. per hour.
8. The MRD of claim 1, wherein said channels are provided with walls composed of electrically conductive material.
9. The MRD of claim 1, wherein said channels are at least partially provided with electrically conductive mesh screens; said mesh screen are adapted to block the propagation of electromagnetic radiation into said channels.
10. The MRD of claim 1 wherein the length of said channels protrude out from said MRD such that said length is about five times larger than the diameter of said channels.
11. The MRD of claim 1, wherein the configuration of each of said channels is provided such that a range of angles of about 20° to about 90° is provided between pairs of said channels.
12. The MRD of claim 2, wherein said temperature sensors are selected from a group consisting of: thermocouples, temperature dependent resistors, optoelectronic means, optical means, thermistors, bimetallic means, diodes, semiconductors, contact means, and noncontact means.
13. The MRD of claim 2, wherein said feedback means is selected from a group consisting of: closed-loop feedback, PID control, electronic control, microprocessor means, and adaptive means.
14. The MRD of claim 1, wherein said forced gas means are selected from a group consisting of: high-pressure lines, low-pressure lines, blowers, fans, and pumps.
15. A method for thermally regulating magnets within a magnetic resonance device (MRD), to room temperature T±ΔT , said method comprising steps of:
   a. obtaining said magnetic resonance device consisting of magnets housed within a cage, said MRD substantially entirely at atmospheric pressure;
   b. obtaining a thermal regulating system (TRS), having:
      i. preset array of one or more opened-bore channels provided within said cage and/or within said magnets;
      ii. means for forcing gas throughout said array of opened-bore channels; and
   c. forcing gas throughout said array of opened-bore channels; thereby thermoregulating said temperature T of said magnets to said preset range of ΔT.
16. The method of claim 15, additionally comprising a step of disposing a plurality of temperature sensors in a location selected from a group consisting of upon the surface of said magnets, within said magnets and any combination thereof.
17. The method of claim 15, additionally comprising step of feedbackly regulating parameters associated with the output of said means for forcing said gas throughout said array of channels according to said temperature sensors.
18. The method of claim 15, additionally comprising a step of providing flow patterns selected from a group consisting of turbulent flow, laminar flow, supersonic flow, subsonic flow and any combination thereof within said channels via introducing said gas into a perpendicular or parallel subset [110] of said channels.
19. The method of claim 15, additionally comprising step of providing said channels with at least partially cylindrical profile characterized by a variable diameter.
20. The method of claim 15, additionally comprising a step of selecting the patterns of said flow from a group consisting of laminar flow, turbulent flow, supersonic flow, subsonic flow and any combination thereof.
21. The method of claim 15, additionally comprising a step of selecting said ΔT to be in a range of about 0° C. to about 0.2° C. per hour.
22. The method of claim 15, additionally comprising step of providing said channels with walls composed of electrically conductive material.
23. The method of claim 15, additionally comprising step of at least partially providing said channels with electrically conductive mesh screens; said mesh screen are adapted to block the propagation of electromagnetic radiation into said channels.
24. The method of claim 15, additionally comprising step of configuring each of said channels such that a range of angles of about 20° to about 90° is provided between pairs of said channels.
25. The method of claim 15, additionally comprising a step of selecting said temperature sensors from a group consisting of: thermocouples, temperature dependent resistors, optoelectronic means, optical means, thermistors, bimetallic means, diodes, semiconductors, contact means, noncontact means and any combination thereof
26. The method of claim 15, additionally comprising a step of selecting said feedback means from a group consisting of: closed-loop feedback, PID control, electronic control, microprocessor means, adaptive means and any combination thereof
27. The method of claim 15, additionally comprising a step of selecting said forced-gas means from a group consisting of: high-pressure lines, low-pressure lines, blowers, fans, and pumps and any combination thereof
28. The method of claim 15, additionally comprising step of screening electromagnetic radiation from propagating into said channels by at least partially providing said channels with electrically conductive mesh screens.

* * * * *